(12) United States Patent
Han et al.

(10) Patent No.: US 7,795,073 B2
(45) Date of Patent: Sep. 14, 2010

(54) METHOD FOR MANUFACTURING STACK PACKAGE USING THROUGH-ELECTRODES

(75) Inventors: Kwon Whan Han, Seoul (KR); Chang Jun Park, Gyeonggi-do (KR); Seong Cheol Kim, Seoul (KR); Sung Min Kim, Seoul (KR); Hyeong Seok Choi, Seoul (KR); Ha Na Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/345,858

(22) Filed: Dec. 30, 2008

(65) Prior Publication Data

US 2009/0197372 A1    Aug. 6, 2009

(30) Foreign Application Priority Data

Feb. 1, 2008    (KR) ...................... 10-2008-0010470
Oct. 21, 2008    (KR) ...................... 10-2008-0103086

(51) Int. Cl.
*H01L 21/44*    (2006.01)
*H01L 21/48*    (2006.01)
*H01L 21/50*    (2006.01)

(52) U.S. Cl. ....................... 438/106; 438/113; 438/460; 257/E21.237; 257/E21.499; 257/E21.503; 257/E21.548; 257/E21.585

(58) Field of Classification Search ................. 438/106, 438/113, 118, 119, 460, 637, 700; 257/E21.237, 257/E21.499, E21.503, E21.548, E21.585
See application file for complete search history.

(56) References Cited

U.S. PATENT DOCUMENTS

| 6,355,501 | B1 * | 3/2002 | Fung et al. ................... 438/107 |
| 6,500,694 | B1 * | 12/2002 | Enquist ...................... 438/109 |
| 6,607,938 | B2 * | 8/2003 | Kwon et al. ................. 438/109 |
| 7,507,637 | B2 * | 3/2009 | Suh et al. .................... 438/458 |
| 7,544,538 | B2 * | 6/2009 | Chung et al. ................ 438/106 |

FOREIGN PATENT DOCUMENTS

| KR | 1020010085939 A | 9/2001 |
| KR | 1020020024624 A | 4/2002 |
| KR | 1020030050665 A | 6/2003 |
| KR | 1020080001589 A | 1/2008 |

* cited by examiner

*Primary Examiner*—David Nhu
(74) *Attorney, Agent, or Firm*—Ladas & Parry LLP

(57) ABSTRACT

Manufacturing a wafer level stack package includes the steps of back-grinding a lower surface of a wafer including a plurality of first semiconductor chips. A support member is attached to a lower surface of the back-grinded wafer. One or more second semiconductor chips are stacked on the respective first semiconductor chips of the back-grinded wafer. First through-electrodes are formed to electrically connect the stacked first semiconductor chips and second semiconductor chips. Third semiconductor chips are attached to uppermost ones of the stacked second semiconductor chips, and the third semiconductor chips have second through-electrodes which are electrically connected to the first through-electrodes and re-distribution lines which are connected to the second through-electrodes. Outside connection terminals are attached to the re-distribution lines of the third semiconductor chips. The first semiconductor chips of a wafer level on which the second and third semiconductor chips are stacked are sawed to for semiconductor packages at a chip level.

18 Claims, 3 Drawing Sheets

METHOD FOR MANUFACTURING STACK PACKAGE USING THROUGH-ELECTRODES

CROSS-REFERENCE TO RELATED APPLICATIONS

The present application claims priority to Korean patent application number 10-2008-0010470 filed on Feb. 1, 2008, and 10-2008-103086 filed on Oct. 21, 2008, which are incorporated herein by reference in their entirety.

BACKGROUND OF THE INVENTION

The present invention relates generally to a method for manufacturing a stack package, and more particularly, to a method for manufacturing a stack package capable of preventing a decrease in manufacturing yield and degradation in a semiconductor chip caused by thermal fatigue.

In the semiconductor industry, packaging technology is being continuously developed in order to satisfy the ongoing demand for miniaturization and mounting reliability. For example, the demand for miniaturization has accelerated the development of a package to the extent that the size of a package is very nearly that of the chip itself. The demand for mounting reliability has accelerated the development of techniques for improving the efficiency of a mounting task and the mechanical and electrical reliability of the device after mounting.

Development trends of electric and electronic appliances are clearly moving towards miniaturization and high functionality. In order to move towards smaller and multi-functioning devises various techniques are being researched and developed to provide semiconductor modules having high capacity. One technique used to provide a semiconductor module with high capacity is to supply a highly integrated semiconductor chip. Because of the desire for miniaturization, there is a limited area in a semiconductor chip in which cells can be formed. Thus, high integration of a semiconductor chip is realized by integrating an increased number of cells within the limited area of the semiconductor chip.

However, the high integration of a memory chip requires high precision techniques (such as a fine line width) and a lengthy development period. Because of these constraints, various stacking techniques have been proposed as another method for providing a semiconductor module having high capacity.

Currently, among the various stacking techniques, the most widely used stacking technique is a stack package that employs through-electrodes. In a stack package employing through-electrodes, stacked semiconductor chips are electrically connected to one another by the through-electrodes. The use of through-electrodes leads to a decrease in the size of the stack package and a shortening of signal transmission paths. Accordingly, stacked packages make it possible to accommodate the trend toward miniaturization and multi-functionality.

Stack packages employing through-electrodes can generally be divided into two types: A first type in which through-electrodes are formed in the chips of a wafer and all processes conducted prior to stacking are completed, and thereafter the chips are sawed and then stacked at a chip level; and a second type in which wafers, which are formed with through-electrodes and have undergone all processes conducted prior to stacking, are stacked at a wafer level, and thereafter sawing is conducted.

While not shown and described in detail, in the first type of forming a stack package, the manufacturing yield can be increased since semiconductor chips having already undergone a testing process can be stacked. However, in the first type, the number of processes needed for manufacturing the stack package increases. Further, when soldering is adopted for stacking semiconductor chips, problems are caused in that the arrangement of solder balls and a soldering temperature causes degradation in the semiconductor chips. In the second type of stack package, it is possible to decrease the processing cost and the processing itself can be simplified. However, all processes are conducted at a wafer level in the second type, and thus problems are caused in that the manufacturing yield of stack packages at the final stages of manufacturing is likely to abruptly decrease due if the manufacturing yield of the plurality of semiconductor chips of the wafers is poor during the initial stages of manufacturing.

Accordingly, when manufacturing stack packages having through-electrodes, a new technique for preventing the manufacturing yield from decreasing and semiconductor chips from degrading due to thermal fatigue is under high demand.

SUMMARY OF THE INVENTION

Embodiments of the present invention are directed to a method for manufacturing a stack package capable of preventing a decrease in the manufacturing yield and degradation in a semiconductor chip caused by thermal fatigue.

In one aspect of the present invention, a method for manufacturing a wafer level stack package comprises the steps of back-grinding a lower surface of a wafer including a plurality of first semiconductor chips; attaching a support member to a lower surface of the back-grinded wafer; stacking one or more second semiconductor chips over the respective first semiconductor chips of the back-grinded wafer; forming first through-electrodes to electrically connect the stacked first semiconductor chips and second semiconductor chips; attaching third semiconductor chips to uppermost ones of the stacked second semiconductor chips, the third semiconductor chips having second through-electrodes which are electrically connected to the first through-electrodes and re-distribution lines which are connected with the second through-electrodes; attaching outside connection terminals to the re-distribution lines of the third semiconductor chips; and sawing the first semiconductor chips of a wafer level on which the second and third semiconductor chips are stacked, into a chip level.

The support member may comprise any one of glass and a wafer carrier.

Stacking of the second semiconductor chips is implemented only over the first semiconductor chips of the back-grinded wafer determined as being good dies.

After the step of forming the first through-electrodes and before the step of attaching the third semiconductor chips, the method further comprises the step of removing the support member.

After the step of attaching the outside connection terminals and before the step of sawing the first semiconductor chips to a chip level, the method further comprises the step of removing the support member.

The step of stacking the second semiconductor chips is implemented using an adhesive or an adhesive tape.

The step of forming the first through-electrodes comprises the steps of defining through-holes by etching the stacked second semiconductor chips and first semiconductor chips until the support member is exposed; and filling a metallic material in the through-holes.

The step of filling the metallic material may be implemented by inserting metal pins or through plating.

The first, second and third semiconductor chips may comprise the same kind of semiconductor chips having the same function.

Alternatively, the first, second and third semiconductor chips comprise different kinds of semiconductor chips having the different functions.

In another aspect of the present invention, a method for manufacturing a wafer level stack package comprises the steps of back-grinding a lower surface of a wafer including a plurality of first semiconductor chips; attaching a support member to a lower surface of the back-grinded wafer; stacking one or more second semiconductor chips over the respective first semiconductor chips of the back-grinded wafer; forming first through-electrodes to electrically connect the stacked first semiconductor chips and second semiconductor chips; attaching third semiconductor chips to uppermost ones of the stacked second semiconductor chips; forming second through-electrodes which are electrically connected to the first through-electrodes and re-distribution lines which are connected to the second through-electrodes, in the third semiconductor chips; attaching outside connection terminals to the re-distribution lines of the third semiconductor chips; and sawing the first semiconductor chips of a wafer level on which the second and third semiconductor chips are stacked, into a chip level.

The support member may comprise any one of glass and a wafer carrier.

Stacking of the second semiconductor chips is implemented only on the first semiconductor chips of the back-grinded wafer determined as being good dies.

After the step of forming the first through-electrodes and before the step of attaching the third semiconductor chips, the method further comprises the step of removing the support member.

After the step of attaching the outside connection terminals and before the step of sawing the first semiconductor chips to a chip level, the method further comprises the step of removing the support member.

The step of stacking the second semiconductor chips may be implemented using an adhesive or an adhesive tape.

The step of forming the first through-electrodes comprises the steps of defining through-holes by etching the stacked second semiconductor chips and first semiconductor chips until the support member is exposed; and filling a metallic material in the through-holes.

The step of filling the metallic material may be implemented by inserting metal pins or through plating.

The first, second and third semiconductor chips may comprise the same kind of semiconductor chips having the same function.

Alternatively, the first, second and third semiconductor chips may comprise different kinds of semiconductor chips having the different functions.

DESCRIPTION OF SPECIFIC EMBODIMENT

The technical principle of the present invention will be briefly described below. In the present invention, after semiconductor chips have been tested and are determined to be good dies, the semiconductor chips are stacked on respective semiconductor chips of a wafer. Through-electrodes are then formed at a wafer level to electrically connect the stacked semiconductor chips. The wafer is then sawed to a chip level, whereby a plurality of stack packages are manufactured.

As a result, in the present invention the number of processes is decreased when compared to the conventional art in which semiconductor chips are stacked at a chip level and then through-electrodes are formed. In the present invention, it is possible to solve the problem associated with semiconductor chips degrading due to soldering temperature. Also, in the present invention, because testing is performed to determine good dies prior to the point at which the semiconductor chips are stacked on semiconductor chips of a wafer level, it is possible to solve the abrupt decrease in yield caused by a poor manufacturing yield of semiconductor chips of wafers during initial stages of fabrication. Specifically, when only semiconductor chips determined to be good dies are stacked only on semiconductor chips of a wafer determined as good dies, the manufacturing yield can be significantly increased.

Hereafter, a specific embodiment of the present invention will be described with reference to the accompanying drawings.

FIGS. 1A through 1F are cross-sectional views shown for illustrating the processes of a method for manufacturing a stack package in accordance with an embodiment of the present invention.

Figure 1A:
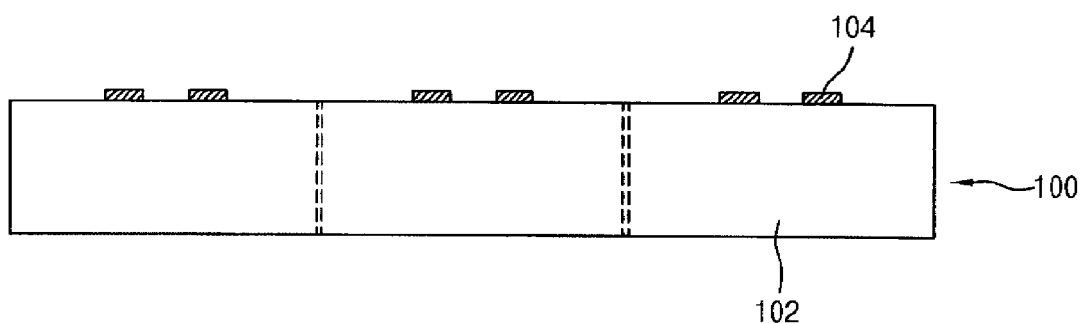
FIGS. 1A through 1F are cross-sectional views shown for illustrating the processes of a method for manufacturing a stack package in accordance with an embodiment of the present invention.

Referring to FIG. 1A, a wafer 100 including a plurality of first semiconductor chips 102 that have been determined to be good dies after being subjected to a test (thereby leading to a high manufacturing yield) is prepared. The respective first semiconductor chips 102 have first bonding pads 104.

Figure 1B:
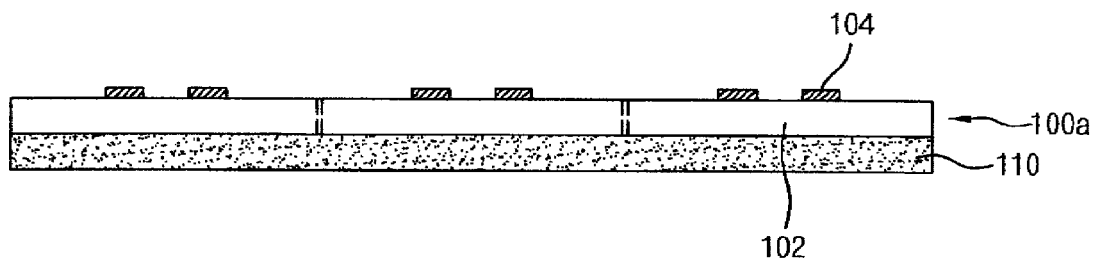

Referring to FIG. 1B, a predetermined thickness of the lower surface of the wafer 100 is back-grinded. The reference numeral 100a designates the back-grinded wafer. A support member 110 such as glass or a wafer carrier is attached to the lower surface of the back-grinded wafer 100a.

Figure 1C:
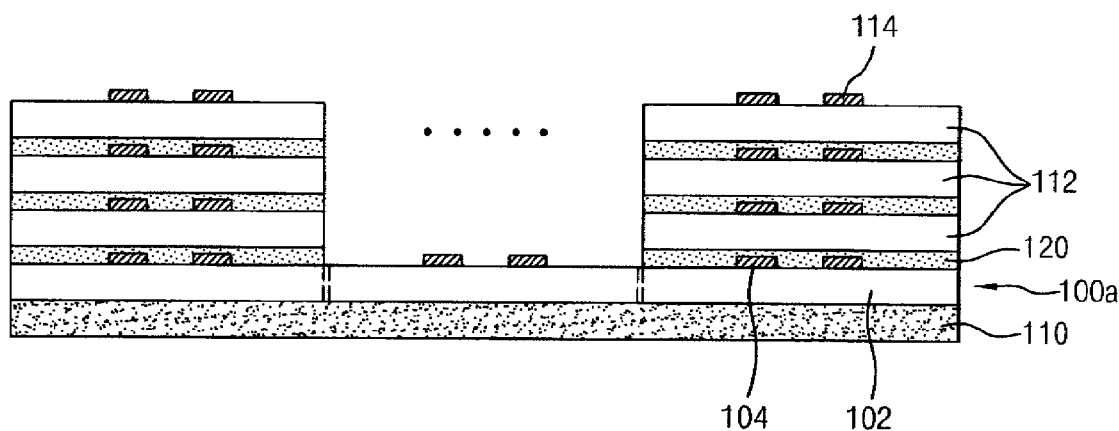

Referring to FIG. 1C, one or more second semiconductor chips 112 are stacked only on those of the first semiconductor chips 102 of the back-grinded wafer 100a having the support member 110 attached to the lower surface thereof determined as good dies. That is, one or more second semiconductor chips is stacked on each of (and only) the first semiconductor chip's 102 determined as being a good die. In one embodiment of the present invention, the second semiconductor chips 112 can be selected from the semiconductor chips determined as good dies from a wafer having a low manufacturing yield. These selected semiconductor chips can then be sawed from the wafer with the low manufacturing yield and then provided as the second semiconductor chips 112. For example, if a wafer is determined as being a wafer with a low yield of good dies, the wafer can be selected for use as a wafer for supplying the second semiconductor chips. In any event, the second semiconductor chips 112 (which are at a chip level) should be semiconductor chips determined as being good dies. The respective second semiconductor chips 112 have second bonding pads 114 and are stacked on corresponding first semiconductor chips 102 (or a second semiconductor chip corresponding to a first semiconductor chip) using an adhesive member 120 such as an adhesive or an adhesive tape. Also, the second semiconductor chips 112 are stacked, for example, face-up, in a manner such that the first bonding pads 104 of the first semiconductor chip 102 and the corresponding second bonding pads 114 of the second semiconductor chips 112 are aligned in vertical lines.

Figure 1D:
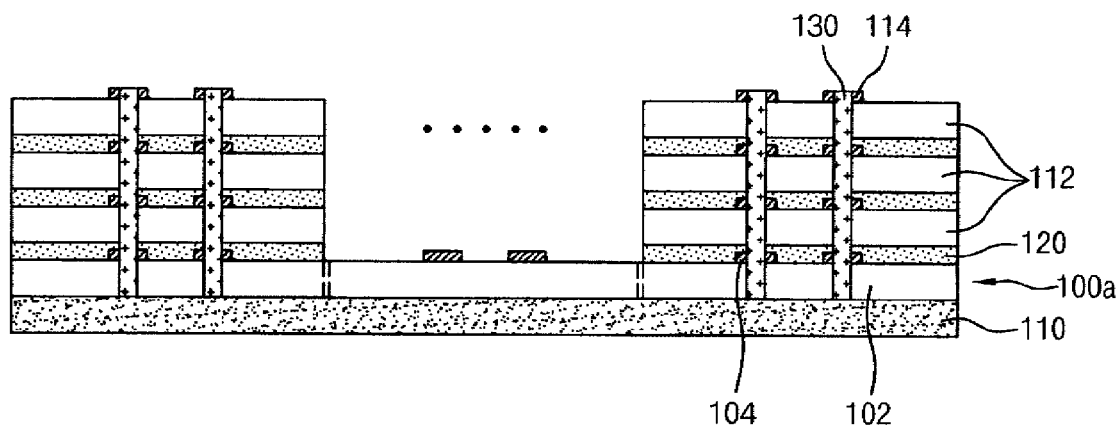

Referring to FIG. 1D, through-holes are defined by etching each of the first semiconductor chips 102 and the one or more second semiconductor chips 112 stacked on the corresponding first semiconductor chip 102 until the support member 110 is exposed. For example, the through-holes are defined to pass through all the bonding pads 104 and 114 of the stacked first semiconductor chips 102 and the respective one or more second semiconductor chips 112 corresponding to the first semiconductor chips, and the bonding pads through which a through-hole is formed are aligned in a vertical line.

First through-electrodes 130 are formed in the through-holes by filling the through-holes with a metallic material in such a way as to connect the corresponding bonding pads 104 and 114 of the stacked first semiconductor chips 102 and second semiconductor chips 112. That is, the bonding pads aligned in a vertical line are connected by the metallic material filled in the corresponding through-hole. The first through-electrodes 130 are formed, for example, through a plating process or by inserting metal pins.

Figure 1E:
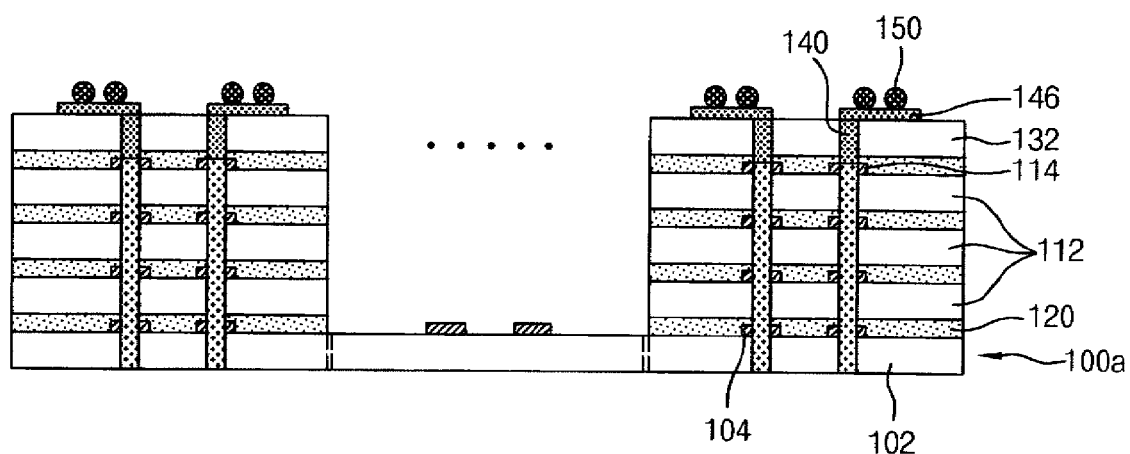

Referring to FIG. 1E, the support member 106 attached to the lower surface of the back-grinded wafer 100a is removed. Third semiconductor chips 132 are attached to the uppermost ones of the stacked second semiconductor chips 112. The third semiconductor chips 132 serve as cap dies and have second through-electrodes 140, which are electrically connected to the first through-electrodes 130, and re-distribution lines 146, which are electrically connected to the second through-electrodes 140. The third semiconductor chips 132 are attached using an adhesive member 120 such as an adhesive or an adhesive tape in the same manner as in the attachment of the second semiconductor chips 112. Outside connection terminals 150 (such as solder balls) serving as mounting means to external circuits are attached to the ball land portions of the re-distribution lines 146 of the third semiconductor chips 132.

Figure 1F:
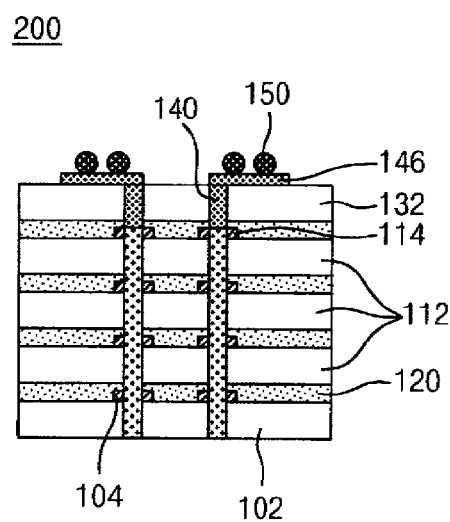

Referring to FIG. 1F, the back-grinded wafer 100a, on which the third semiconductor chips 132 having the outside connection terminals 150 attached thereto and one or more second semiconductor chips 112 are stacked, is sawed. Through this sawing, a stack package 200 according to an embodiment of the present invention, in which the first semiconductor chips 102, one or more second semiconductor chips 112 and the third semiconductor chips 132 serving as cap dies are stacked and are electrically connected to one another by the first and second through-electrodes 130 and 140, is formed.

As is apparent from the above description, in the present invention, individual semiconductor chips determined as good dies are stacked on corresponding respective semiconductor chips (the semiconductor chips being good dies) of a wafer having a number of good dies (and therefore having a high manufacturing yield) using an adhesive member such as an adhesive or an adhesive tape. Through-electrodes are formed to electrically connect the semiconductor chips stacked at a wafer level, and thereafter the wafer is sawed to a chip level, whereby stack packages are manufactured.

Accordingly, in the present invention, only the good dies are stacked, and thereby the manufacturing yield can be increased when compared to the conventional art. Specifically, when the semiconductor chips determined as good dies are stacked only on the semiconductor chips of a wafer which are also determined as good dies, the manufacturing yield can be further increased. Also, in the present invention, the complicated process of forming the through-electrodes is conducted at a wafer level rather than a chip level, and therefore the number of processes and processing costs can be decreased. In addition, in the present invention, the semiconductor chips are stacked using an adhesive member and accordingly do not require a thermal process; therefore, it is possible to prevent the semiconductor chips from degrading due to thermal fatigue.

In a method for manufacturing a stack package according to an embodiment of the present invention, the first through third semiconductor chips stacked upon one another can comprise the same kind of semiconductor chips or different kinds of semiconductor chips as the occasion demands.

While in an aforementioned embodiment described above the support member attached to the lower surface of the back-grinded wafer is removed before attaching the third semiconductor chips, it should be appreciated that the support member can be removed after attaching the third semiconductor chips or attaching the outside connection terminals to the re-distribution lines.

Moreover, in the method for manufacturing a stack package according to an embodiment of the present invention described above, the third semiconductor chips serving as cap dies are attached to the second semiconductor chips in the state in which they are formed with the second through-electrodes and the re-distribution lines. In this regard, in another embodiment of the present invention, it can be envisaged that, after the third semiconductor chips are attached to the second semiconductor chips while not having second through-electrodes and re-distribution lines, second through-electrodes and re-distribution lines can be formed in and on the attached third semiconductor chips. In the method for manufacturing a stack package according to another embodiment of the present invention, the remaining processes, excluding the processes for attaching the third semiconductor chips and forming the second through-electrodes and the re-distribution lines, are the same as those of the aforementioned embodiment.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a wafer level stack package, comprising:

back-grinding a lower surface of a wafer comprising a plurality of first semiconductor chips, the first semiconductor chips being at a wafer level;

attaching a support member to a lower surface of the back-grinded wafer;

stacking one or more individual second semiconductor chips over corresponding ones of the first semiconductor chips by interposing an adhesive or an adhesive tape between adjacent stacked semiconductor chips of the first and second semiconductor chips;

forming first through-electrodes to electrically connect the first semiconductor chips to the corresponding one or more second semiconductor chips;

attaching third semiconductor chips to respective uppermost ones of the stacked second semiconductor chips, the third semiconductor chips having second through-electrodes electrically connected to the first through-electrodes and re-distribution lines electrically connected to the second through-electrodes;

attaching outside connection terminals to the re-distribution lines of the third semiconductor chips; and sawing the first semiconductor chips of the wafer level having the corresponding second and third semiconductor chips stacked thereon, such that the first semiconductor chips are at a chip level.

2. The method for manufacturing a wafer level stack package according to claim 1, wherein the support member comprises any one of glass and a wafer carrier.

3. The method for manufacturing a wafer level stack package according to claim 1, further comprising the step of determining whether the first semiconductor chips of the back-grinded wafer are good dies,
wherein the second semiconductor chips are stacked only over the first semiconductor chips determined as good dies.

4. The method for manufacturing a wafer level stack package according to claim 1, further comprising the step of:
after forming the first through-electrodes and before attaching the third semiconductor chips, removing the support member.

5. The method for manufacturing a wafer level stack package according to claim 1, further comprising the step of:
after attaching the outside connection terminals and before sawing the first semiconductor chips such that the first semiconductor chips are at a chip level, removing the support member.

6. The method for manufacturing a wafer level stack package according to claim 1, wherein the step of forming the first through-electrodes comprises the steps of:
etching the respective first semiconductor chips and the one or more second semiconductor chips stacked on the corresponding respective first semiconductor chips to define through-holes exposing the support member; and
filling a metallic material in the respective through-holes.

7. The method for manufacturing a wafer level stack package according to claim 6, wherein the step of filling the metallic material comprises inserting metal pins or plating.

8. The method for manufacturing a wafer level stack package according to claim 1, wherein each of the first, second and third semiconductor chips comprises the same kind of semiconductor chip each semiconductor chip having the same function.

9. The method for manufacturing a wafer level stack package according to claim 1, wherein the first, second and third semiconductor chips each comprises a different kind of semiconductor chip each semiconductor chip having a different function.

10. A method for manufacturing a wafer level stack package, comprising:
providing a wafer including a plurality of first semiconductor chips, the first semiconductor chips being at a wafer level;
stacking one or more individual second semiconductor chips over corresponding ones of the first semiconductor chips of the wafer level by interposing an adhesive or an adhesive tape between adjacent stacked semiconductor chips of the first and second semiconductor chips;
forming first through-electrodes to electrically connect the first semiconductor chips to the corresponding one or more individual second semiconductor chips; and
sawing the first semiconductor chips of the wafer level having the corresponding individual second semiconductor chips stacked thereon, such that the first semiconductor chips are at a chip level.

11. The method for manufacturing a wafer level stack package according to claim 10, further comprising the steps of:
attaching third semiconductor chips to respective uppermost ones of the stacked second semiconductor chips;
forming second through electrodes in the attached third semiconductor chip such that the second through electrodes are electrically connected to the first through electrodes;
forming re-distribution lines on the third semiconductor chip such that the re-distribution lines are electrically connected to the second through electrodes; and
attaching outside connection terminals to the re-distribution lines of the third semiconductor chips.

12. The method for manufacturing a wafer level stack package according to claim 11, wherein the step of providing a wafer comprises the steps of:
back-grinding a lower surface of the wafer comprising the plurality of first semiconductor chips; and
attaching a support member to a lower surface of the back grinded wafer.

13. The method for manufacturing a wafer level stack package according to claim 12, further comprising the steps of:
after forming the first through-electrodes and before attaching the third semiconductor chips, removing the support member.

14. The method for manufacturing a wafer level stack package according to claim 12, further comprising the steps of:
after the step of attaching the outside connection terminals and before the step of sawing the first semiconductor chips such that the first semiconductor chips are at a chip level, removing the support member.

15. The method for manufacturing a wafer level stack package according to claim 10, further comprising the step of determining whether the first semiconductor chips are good dies,
wherein the second semiconductor chips are stacked only on the first semiconductor chips determined as good dies.

16. The method for manufacturing a wafer level stack package according to claim 10, wherein the step of forming the first through-electrodes comprises the steps of:
etching the respective first semiconductor chips and the one or more second semiconductor chips stacked on the corresponding respective first semiconductor chips to define through-holes exposing the support member; and
filling a metallic material in the respective through-holes.

17. The method for manufacturing a wafer level stack package according to claim 16, wherein the step of filling the metallic material comprises inserting metal pins or plating.

18. The method for manufacturing a wafer level stack package according to claim 10, wherein each of the first, second and third semiconductor chips comprise the same kind of semiconductor chips each having the same function or different kinds of semiconductor chips each having different functions.

* * * * *